United States Patent [19]
Kitayoshi

[11] Patent Number: 5,974,178
[45] Date of Patent: Oct. 26, 1999

[54] WAVESOURCE IMAGE VISUALIZATION METHOD USING A PARTIAL DIVISION FAST FOURIER TRANSFORM

[75] Inventor: Hitoshi Kitayoshi, Tokyo, Japan

[73] Assignee: Advantest Corporation, Tokyo, Japan

[21] Appl. No.: 08/942,614

[22] Filed: Oct. 2, 1997

[30] Foreign Application Priority Data

Oct. 7, 1996 [JP] Japan .................................. 8-265997
Oct. 9, 1996 [JP] Japan .................................. 8-268249

[51] Int. Cl.$^6$ .............................. G06K 9/76; G06K 9/36
[52] U.S. Cl. ..................... 382/210; 382/280; 356/347; 359/9; 342/362
[58] Field of Search ........................ 382/210–211, 276, 382/278, 280; 356/345–348, 360; 359/9, 22, 29, 32–33, 900–902, 3, 23–25; 324/76.19, 76.21; 342/179–180, 195–196, 361–362

[56] References Cited

U.S. PATENT DOCUMENTS 5,734,347  3/1998  McEligot ............................. 342/159
5,748,314  5/1998  Kitayoshi ............................ 356/346

FOREIGN PATENT DOCUMENTS 0 667 538   8/1995   European Pat. Off. .
WO 93/05408  3/1993   WIPO .

OTHER PUBLICATIONS

E.N. Voronin, Radioelectronics and Communication Systems, vol. 33, No. 2, pp. 54–65, "Efficient Numberical Holographic–Reconstruction Algorithms", 1990.

Hitoshi Kitayoshi, "High Resolution Technique for Short Time Frequency Spectrum Analysis", IEICE, vol. J76–A, No. 1, Jan. 1993, pp. 78–81.
Hitoshi Kitayoshi, "High Resolution Technique for 2–D Complex Spectrum Analysis", IEICE, Transactions on A, vol. J76–A, No. 4, Apr. 1993, pp. 687–689.

Primary Examiner—Leo H. Boudreau
Assistant Examiner—Bhavesh Mehta
Attorney, Agent, or Firm—Oblon, Spivak, McClelland, Maier & Neustadt, P.C.

[57] ABSTRACT

The reconstruction region of a hologram reconstructed image is segmented. A fast Fourier transform (FFT) is carried out after multiplying the hologram measurement data V(R) by a weighting function. A fast Fourier transform (FFT) is carried out after multiplying the antenna sensitivity inverse matrix $A^{-1}(R'_{a,b})$ for each segment by inverse propagation function $r'_{a,b}\exp(j2\pi r'_{a,b}/\lambda)$ to find $B^{-1}_{a,b}(s, t)$, and then multiplying this by a weighting function. After the two FFT outputs are multiplied by each other, inverse fast Fourier transform (IFFT) is carried out. Compensation is performed for the weighting function and the output is made the segment reconstructed image. In addition, radio hologram observation is carried out at two scan surfaces, a horizontal polarization antenna and a vertical polarization antenna are placed at each scan surface, and the voltage vector distribution received by the antennas is stored. The sizes of the error of the reception antenna sensitivity matrix of the vertical polarization reception antenna and the error of the reception antenna sensitivity matrix of the horizontal polarization reception antenna are found, and the received voltage vectors and reception antenna sensitivity inverse matrices are selectively used to find and visualize the three wavesource current vector components.

3 Claims, 10 Drawing Sheets

| IMAGE SPREAD | $Z'=200$ cm $Y_S=0$ cm | OBSER-VATIONAL FREQU-ENCY | VISUALIZATION COMPONENT | VISUALIZATION RESOLUTION OF A POINT WAVE ($\lambda$) SOURCE | |
|---|---|---|---|---|---|
| | | | | THEORETICAL VALUE | EXPERIMENTAL VALUE |
| -3 dB | $X_S=0$ cm | 9GHz | Jx | 3.54 | 3.62 |
| | | 10GHz | | 3.54 | 3.60 |
| | $X_S=120$ cm | 10GHz | Jx | 5.55 | 5.43 |
| | | | Jy | 5.58 | 5.37 |
| -20 dB | $X_S=0$ cm | 10GHz | Jx | 7.80 | 8.10 |
| | | 9GHz | | 7.91 | 7.86 |
| | $X_S=120$ cm | 9GHz | Jx | 12.07 | 11.83 |
| | | | Jy | 12.23 | 11.80 |

(a) Door closed (b) Door open

WAVESOURCE IMAGE VISUALIZATION METHOD USING A PARTIAL DIVISION FAST FOURIER TRANSFORM

BACKGROUND OF THE INVENTION

1. Field of the Invention:

The present invention relates to a wavesource image visualization method based on hologram measurement data obtained by radio wave hologram observation.

2. Description of the Related Art:

Radiowave visualization methods that employ wave interference include both active visualizing techniques such as in synthetic aperture radar, snow radar, and underground radar as well as passive visualizing methods such as radioastronomy and radiometry [(1) Masaru Matsuo, Kuniyoshi Yamane: Radar Holography, Electronic Communication Society, Ed., 1980. (2) Yoshinao Aoki: Wave Signal Processing, Morikita Shuppan, 1986.]. Such methods have already been proposed for applications in probing wavesources of unwanted radiowave emission [(3) Jun'lichi Kikuchi, Motoyuki Sato, Yoji Nagasawa, Risaburo Sato; A Proposal for Searching the Electromagnetic Wave Sources by Using a Synthetic Aperture Technique, IECE transactions on B, Vol. J68-B, No. 10, pp. 1194–1201, October 1985.]. Spectral high-resolution algorithms by means of MLM (Maximum Likelihood Method), MEM (Maximum Entropy Method), and MUSIC (MUltiple SIgnal Classification) [(4) S. Kesler, Ed.: Modem Spectrum Analysis II, IEEE Press, 1986)] or improved ESPRIT (Estimation of Signal Parameters via Rotational Invariance Techniques) [(5) R. Roy and T. Kailath: ESPRIT-Estimation of Signal Parameters via Rotational Invariance Techniques, IEEE Transactions on Acoustics, Speech, and Signal Processing. Vol. ASSP-37, No. 7, pp. 984–995, July 1989.] have also been proposed for realizing higher resolutions in the probing of a distant wavesource. In addition, examples of the application of MEM algorithms to the probing of a nearby wavesource have also been reported [(2) Yoshinao Aoki: Wave Signal Processing, Morikita Shuppan, 1986. (6) Jun'ichi Kikuchi, Yoji Nagasawa: Search for Electromagnetic Wave Sources by Using the Maximum Entropy Method, IECE Transactions on B, Vol. J69-B, No. 9, pp. 949–957, September 1986.].

MLM, MUSIC, and ESPRIT, however, are limited to the estimation of point sources, and in MEM, either a point wavesource reconstruction mode or a wavesource reconstruction mode having a normal distribution spread can be selected in accordance with the number of prediction error filter terms.

When dealing with unwanted emission from an actual device, however, the wavesource is rarely distributed as a limited number of point-like sources and is more likely to be an expansive planar wavesource. In other words, in visualizing the wavesource distribution of an unclear configuration, the above-mentioned algorithms are considered inappropriate. Visualization that takes unwanted emission as its object should therefore take the wavesource distribution as a continuous wavesource distribution rather than as an assemblage of a limited number of point wavesources. The inventors of the present invention have also proposed an algorithm SPIM (Spectrum Phase Interpolation Method) and its application for reconstructing a correct wavesource image of a configuration in which point wavesources coexist with a wavesource that spreads over an area [(7) Hitoshi Kitayoshi: High Resolution Technique for Short Time Frequency Spectrum Analysis, IEICE Transactions on A, Vol. J76-A, No. 1, pp. 78–81, January 1993; (8) Hitoshi Kitayoshi: High Resolution Technique for 2-D Complex Spectrum Analysis, IEICE Transactions on A, Vol. J76-A, No. 4, pp. 687–689, April 1993].

Nevertheless, this method also requires the setting of a threshold value for estimating a point wavesource and is therefore inadequate for the visualization of unwanted emission. An example has been reported in which, as a visualization technique for dealing with a continuous wavesource distribution, the relation between the observed field and a wavesource of an arbitrary shape is represented as a Fresnel-Kirchhoff diffraction integral [(9) Yoshinao Aoki, Shigeki Ishizuka: Numerical Two-Dimensional Fresnel Transform Methods, IECE Transactions on B, Vol. J57-B, No. 8, pp. 511–518, August 1974]. This method, however, imposes a limit on the region that can be visualized because it takes a Fresnel region as its object. This method further suffers from the drawback of bad resolution at the edges of the visualized range because a quasi-Fourier transform is used and the reconstruction results become wave space.

Finally, research into field measurement that takes into consideration the directivity of the antenna includes field measurement in the vicinity of the antenna [(10) A.D. Yaghjian: An Overview of Near-Field Antenna Measurements, IEEE Transactions on Antennas and Propagation, Vol. AP-34, No. 1, pp. 30–45, January 1986; and (11) Tasuku Teshirogi, Near-Field Antenna Measurement, IECE Magazine, Vol. 62, No. 10, pp. 1145–1153, October 1979.]. In these cases, however, field distribution is measured using a sufficiently large measurement surface (D×D) with respect to the antenna (L×L), which is the object of observation, under conditions in which L<D. The probe antenna used in measurement, considered in terms of its characteristics, is a device for investigating far-field, and the method therefore cannot be used unaltered under conditions in which L>D.

Next will be explained a radio hologram numerical reconstruction method of the prior art that does not employ Fresnel approximation or Fraunhofer approximation.

A surface current source J(R') exists at wavesource point x', y', z' on the orthogonal coordinates shown in the hologram observation model of FIG. 1, and the field of observation point x, y; z=0 thereby created is E(R). In addition, the range of distribution of wavesource J(R') is a finite two-dimensional plane at z=z' where:

$-L/2 \leq x' \leq L/2$ and $-L/2 \leq y' \leq L/2$;

and the range of observation of E(R) is also a finite two-dimensional plane at z=0 where:

$-D/2 \leq x$ $D/2$ and $-D/2 \leq y \leq D/2$.

Here, using a dyadic Green's function G in three-dimensional free space, E(R) can be represented by:

$$E(R) = -j\omega\mu_0 \int_{-\frac{L}{2}}^{\frac{L}{2}} \int_{-\frac{L}{2}}^{\frac{L}{2}} \tilde{G}(R-R') \cdot J(R') dx' dy' \quad (1)$$

However, if the effective vector length of an antenna used for observing field vector E is set at $l_1$ and the wavelength is $\lambda$, the voltage V for receiving in the region $r=|R-R'|>>\lambda$ is:

$$V = g \, l_1 \cdot E \quad (2)$$

Here, g is a constant. In other words, $l_1$ can be seen as a function indicating directivity and sensitivity that does not depend on distance r. From equations (1) and (2), the output voltage from an antenna positioned at observation point R can be given by:

$$V(R) = -j\omega\mu_0 g \int_{-\frac{L}{2}}^{\frac{L}{2}} \int_{-\frac{L}{2}}^{\frac{L}{2}} l_1(R-R') \cdot \tilde{G}(R-R') \cdot J(R') dx' dy' \quad (3)$$

Equation (3) gives reception voltage by any antenna with respect to any surface current distribution. If the antenna scan system is considered in actual hologram measurement, however, an antenna that receives the field in the x and y directions can be easily realized, but accurate reception of the field in the z direction is extremely difficult. Despite the presence of a current vector of the z component on the surface of the device which is the object of measurement, almost nothing is received in the hologram measurement plane.

The discussion hereinbelow is limited to a case in which the plane current has only a horizontal component and a vertical component, and reception is by antennas of horizontal polarization and vertical polarization.

Antennas of horizontal polarization and vertical polarization are placed in the hologram measurement plane, and the voltage vectors thereby received are:

$$V(R) = \begin{bmatrix} V_h & (R) \\ V_v & (R) \end{bmatrix} = g \begin{bmatrix} l_1^h \\ l_1^v \end{bmatrix} \cdot E(R) \quad (4)$$

Here, $V_h$ and $V_v$ are the received voltages of the horizontal polarization and vertical polarization antennas, and $l^h_1$ and $l^v_1$ are the effective vector lengths of these antennas. The device employs two reception antennas of the same form, the main polarization sensitivity is $A\theta$, and the cross polarization sensitivity is $A\phi$. In addition, the zenith angle and azimuth angle of point R' are $\theta_h$ and $\phi_h$ as seen from horizontal polarization reception antenna positioned at point R, and the zenith angle and azimuth angle of point R' are $\theta_v$ and $\phi_v$ as seen from the vertical polarization reception antenna. Here, azimuth angles $\phi_h$ and $\phi_v$ represent angles measured with respect to the direction of the x axis and y axis, respectively.

If the portion included on the right side of equation (3) that represents the reception sensitivity due to the point current source is represented as:

$$\tilde{B}(R-R') = -j\omega\mu_0 g \begin{bmatrix} l_1^h(R-R') \\ l_1^v(R-R') \end{bmatrix} \cdot \tilde{G}(R-R') \quad (5)$$

$$= \begin{bmatrix} A\theta(\theta_h, \phi_h)\sin\theta_h & A\phi(\theta_h, \phi_h)\sin\theta_v \\ A\phi(\theta_v, \phi_v)\sin\theta_h & A\theta(\theta_v, \phi_v)\sin\theta_v \end{bmatrix} \frac{\exp(-2\pi r/\lambda)}{r}$$

$$= \tilde{A}(R-R') \frac{\exp(-2j\pi r/\lambda)}{r}$$

$V_h$ and $V_v$ can be found from the following equation, based on equations (3) and (4):

$$V(R) = \int_{-\frac{L}{2}}^{\frac{L}{2}} \int_{-\frac{L}{2}}^{\frac{L}{2}} \tilde{B}(R-R') \cdot J(R') dx' dy' \quad (6)$$

On the other hand, equations (5) and (6) produce:

$$J(R') = \tilde{A}^{-1}(R-R') \cdot V(R) \cdot \exp(j2\pi r/\lambda) \cdot r dx dy \quad (7)$$

According to equation (4), the received voltage vectors are:

$$V(R) = \begin{bmatrix} V_h & (R) \\ V_v & (R) \end{bmatrix} = \begin{bmatrix} V_h(x, y) \\ V_v(x, y) \end{bmatrix} \quad (8)$$

And from equation (7), only two wavesource current vector components are visualized for these voltage vectors:

$$J(R') = \begin{bmatrix} J_x & (R') \\ J_y & (R') \end{bmatrix} = \begin{bmatrix} J_x(x', y', z) \\ J_y(x', y', z) \end{bmatrix} \quad (9)$$

The above-described prior art has the following problems:

Based on equation (6), V(R) has N×N items of data and visualized point of J(R') has M×M items, thereby requiring computation on the order of $N^2 \times M^2$ and further requiring a considerable amount of time to obtain the visualization results.

Wavesource current vector cannot be accurately measured because, based on equation (9), no consideration is given to the directivity corresponding to the $J_z$ component of a probe antenna used in the measurement of V(R). In addition, only two components of the wavesource current vectors can be visualized.

SUMMARY OF THE INVENTION

The object of the present invention is to provide a wavesource image visualization method that allows faster computational holography using a partial division FFT (Fast Fourier Transform) and that can reduce to a practical level the time needed to obtain visualization results.

Another object of the present invention is to provide a wavesource image visualization method that allows visualization of three wavesource current vector components from hologram measurement data.

The wavesource image visualization method of the present invention is realized by computational holography, which is a numerical reconstruction method of hologram measurement data obtained by means of radio hologram observation; and comprises:

a step of segmenting the reconstruction region of a hologram reconstructed image by the size of the hologram measurement surface;

a step of executing a first FFT (Fast Fourier Transform) after multiplying hologram measurement data by a weighting function;

a step of executing a second FFT after giving the reconstruction focal distance and a numeral pair designating a segment of a reconstructed image, and multiplying by a weighting function a value obtained by multiplying an antenna sensitivity inverse matrix for each segment by an inverse propagation function;

a step of executing IFFT (Inverse Fast Fourier Transform) after multiplying the output of the first FFT by the second FFT;

a step of compensating, in segment units, the weighting function used in multiplying the hologram measurement data;

a step of compensating, in units of the reconstruction region, the weighting function used in multiplying the value obtained by multiplying the antenna sensitivity inverse matrix for each segment by the inverse propagation function;

a step of displaying the output of this step at a position that designates the segment and making the output of that step a segment reconstructed image; and performing all of these operations for all segments, and producing a hologram reconstructed image.

The use of partial division FFT thereby reduces the time necessary for obtaining the visualization results from hologram measurement data.

In addition, the segmenting may overlap.

In other words, through segmentation of the reconstruction area of a hologram reconstructed image in which segments overlap, the use of data at edges where cutting error is great can be avoided and a reconstructed image can be generated in segment units in which accuracy improves with proximity to the center of each segment.

The wavesource image visualization method of the present invention allows visualization of wavesource current vector components from hologram measurement data obtained by means of radio hologram observation, and comprises:

a step of carrying out radio hologram observation on two scan surfaces, a first scan surface and a second scan surface, placing at least two probe antennas, a horizontal polarization antenna and a vertical polarization antenna, on each scan surface, and recording the voltage vector distribution received by the antennas;

a step of calculating the total directional characteristics of the probe antennas using a moment method, and finding the reception antenna sensitivity matrix of the horizontal polarization reception antenna and the reception antenna sensitivity matrix of the vertical polarization reception antenna due to wavesource current vectors; and a step of comparing the determinants of the reception antenna sensitivity matrices, finding the magnitude of error of the reception antenna sensitivity matrix of the vertical polarization reception antenna and error of the reception antenna sensitivity matrix of the horizontal polarization reception antenna, and selectively using received voltage vectors and reception antenna sensitivity inverse matrices to find and visualize three wavesource current vector components.

The three wavesource current vectors components can thus be visualized from hologram measurement data by carrying out each of the above-described steps.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
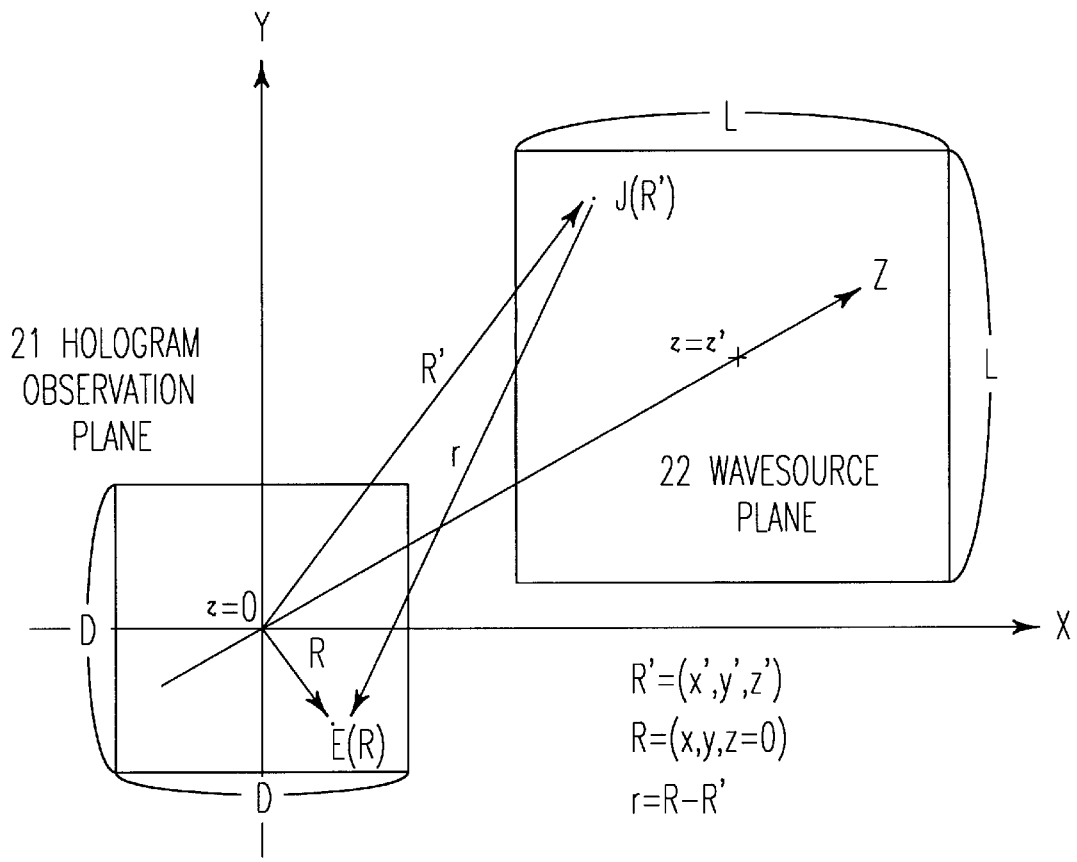
FIG. 1 shows a model of hologram observation.

The first embodiment of the present invention employs a method of deriving the hologram numerical reconstruction method of the prior art, which does not use Fresnel approximation or Fraunhofer approximation, from a Fourier transform by means of partial division and includes compensation of the directivity of reception antennas.

First, in equation (6), the observation range E(R) is $-D/2 \leq x \leq D/2$ and $-D/2 \leq y \leq D/2$. A case in which D<L (a wide range of wavesource distribution with respect to the range of measurement) is first considered. Here, if M is a positive integer and:

$$L = MD \tag{10}$$

the modification shown in the following equation is possible:

$$V(R) = \sum_{m=0}^{M-1} \sum_{n=0}^{M-1} \int_{-\frac{D}{2}}^{\frac{D}{2}} \int_{-\frac{D}{2}}^{\frac{D}{2}} \tilde{B}(R - R'_{m,n}) \cdot J(R'_{m,n}) ds dt \tag{11}$$

Here, $R'_{m,n} = (S+x_m, t+Y_n, z')$, and $x_m$ and $y_n$ are given by:

$$x_m = (m-(M-1)/2)D \tag{12}$$

$$y_n = (n-(M-1)/2)D \tag{13}$$

In this case, $$\tilde{B}_{m,n}(s,t) = \frac{\tilde{A}(R'_{m,n})}{r'_{m,n}} \exp(-j2\pi r'_{m,n}/\lambda) \tag{14}$$

where $r'_{m,n} = |R'_{m,n}|$.

As can be understood from equation (5) and equation (14), equation (11) is a convolution integral of $J(R'_{m,n})$ and $B_{m,n}(s, t)$, and equation (11) is therefore modified by representing the Fourier transform at two-dimensional (s, t) as $F\{\cdot\}$, and the inverse Fourier transform as $F^{-1}\{\cdot\}$.

$$V(R) = \sum_{m=0}^{M-1} \sum_{m=0}^{M-1} F^{-1}\{F\{\tilde{B}_{m,n}(s,t)\} \cdot F\{J(R'_{m,n})\}\} \tag{15}$$

In addition, using the concurrence of the size of the V(R) observation surface and the size of (s, t) surface, Fourier transform and multiplication by $F\{B^{-1}_{a,b}(s,t)\}$ of both sides of equation (15) yields:

$$F\{\tilde{B}^{-1}_{a,b}(s,t)\}\cdot F\{V(R)\} = \qquad (16)$$

$$F\{\tilde{B}^{-1}_{a,b}(s,t)\}\cdot\left(\sum_{m=0}^{M-1}\sum_{m=0}^{M-1}F\{\tilde{B}_{m,n}(s,t)\}\cdot F\{J(R'_{m,n})\}\right)$$

Here, $$\tilde{B}^{-1}_{a,b}(s,t)=\tilde{A}^{-1}(R'_{a,b})r'_{a,b}\exp(j2\pi r'_{a,b}/\lambda) \qquad (17)$$

and $A^{-1}(R'_{a,b})$ is the inverse matrix of $A(R'_{a,b})$.

Based on equations (14) and (17) on the right side of equation (16), when the change in amplitude of $A(R'_{m,n})$ with respect to s and t is sufficiently gradual, and moreover, when the change in phase is sufficiently small compared to $2\pi r'_{m,n}/\lambda$, i.e., when the amplitude and phase directivity of a reception antenna are not complex, $F\{B^{-1}_{a,b}(s,t)\}\cdot F\{B_{m,n}(s,t)\}$ becomes a unit matrix only when both m=a and n=b, and otherwise substantially equals zero. Accordingly, equation (16) becomes:

$$F\{\tilde{B}^{-1}_{a,b}(s,t)\}\cdot F\{V(R)\}=F\{J(R'_{a,b})\} \qquad (18)$$

An inverse Fourier transform of the right side yields:

$$J(R'_{a,b})=F^{-1}\{F\{\tilde{B}^{-1}_{a,b}(s,t)\}\cdot F\{V(R)\}\} \qquad (19)$$

Wavesource distribution J(R') is then found based on hologram measurement data V(R). Here, $$J(R')=\begin{bmatrix}Jx\ (R')\\Jy\ (R')\end{bmatrix} \qquad (20)$$

In this way, of the object surfaces that are divided by M×M, the number a,b of the surface that is to be visualized is substituted into equation (19), whereby the wavesource of this surface can be estimated. In addition, a rapid computation can be achieved by using two-dimensional FFT for the Fourier transform and inverse Fourier transform included in equation (19).

If the number of data items for V(R) is N×N and the number of data items of J(R') to be visualized is M×M, the use of equation (19) reduces the amount of computation to the order of $20(M/N)^2 \times N \log_2 (2N)$, and the amount of time necessary for obtaining visualization results is also reduced. For example, in a case in which N=64 and M=640, the amount of computation can be reduced to about 1/1000 that of the method of the prior art.

Figure 2:
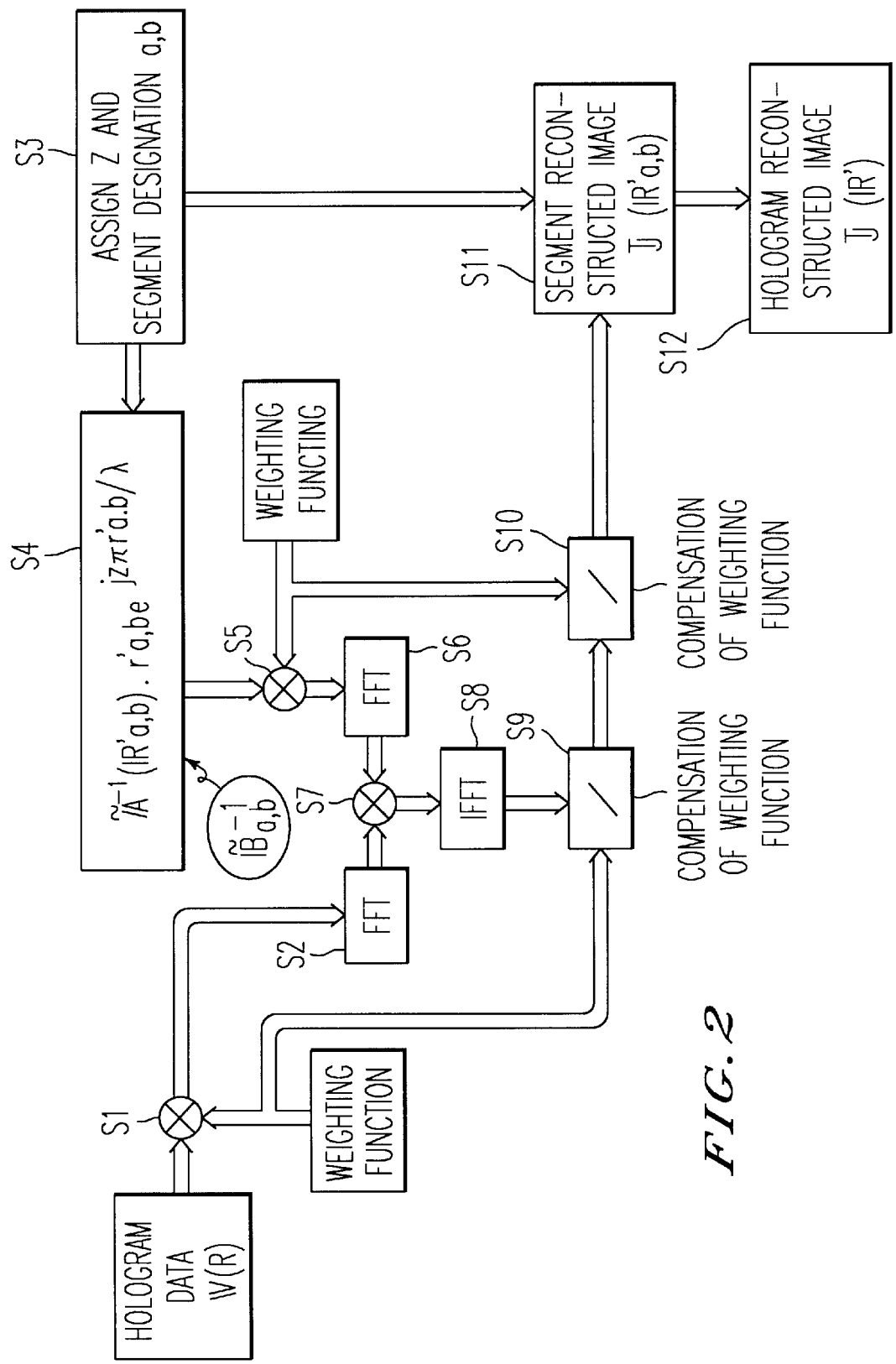
FIG. 2 is a flow chart showing the first embodiment of the present invention.

FIG. 2 is a flow chart showing the first embodiment of the present invention for carrying-out the computation of equation (19). A modification of the first embodiment of the present invention will next be explained with reference to FIG. 2.

First, the reconstruction area of a reconstructed hologram image is segmented by the size (D×D) of a hologram measurement surface. Next, the hologram measurement data V(R) is multiplied by a weighting function (for example, cos $(\pi|R|/2^{1/2}D))^{1/2}$·(S1), following which a fast Fourier transform (FFT) is carried out (S2).

Next, a and b, which designate a segment of the reconstructed image, and a reconstruction focal distance z are assigned (S3), and the antenna sensitivity inverse matrix $A^{-1}(R'_{a,b})$ is multiplied by the inverse propagation function $r'_{a,b} \exp(j2\pi r'_{a,b}/\lambda)$ for each segment to find $B^{-1}_{a,b}(s,t)$ (S4). This product is in turn multiplied by a weighting function (for example, cos (|R|/2c)) (S5), and a fast Fourier transform (FFT) is performed (S6). After multiplying the outputs of S2 and S6 (S7), an inverse fast Fourier transform is performed (S8), following which compensation of the weighting function used to multiply hologram measurement data V(R) is carried out in segment units (S9), and compensation of the weighting function used to multiply $B^{-1}_{a,b}(s,t)$ is carried out in reconstruction area units (S10). The output of S10 is stored at the position of segment a, b and displayed, and made the reconstructed image of the segment (S11).

The above-described operations are carried out for all segments to produce the hologram reconstructed image (S12).

The divided segments of the reconstruction area of the hologram reconstructed image may overlap. This eliminates use of the data at the cut edges where error tends to be great, thereby enabling generation of a reconstructed image of each segment unit which improves in accuracy with proximity to the center of the segment.

Next will be described the results of an investigation relating to the range of application as well as the resolution and accuracy of this embodiment of the present invention by means of computer simulation.

The reception antenna used in hologram measurement employs a dipole antenna with an affixed reflection plate to reduce changes in antenna directivity due to the antenna scan system. The antenna actually used in experimentation has a coaxial semirigid cable that protrudes exactly $\lambda/4$ from the center of a base plate measuring $2.3\lambda$x by $2.3\lambda$ as a reflector. The outer conductor of the protruding coaxial cable is split into two by slits $\lambda/4$ in length, one end of the outer conductor being connected with the coaxial core conductor and the other end simply being connected with dipole antenna, thereby serving as a balun.

Figure 3:
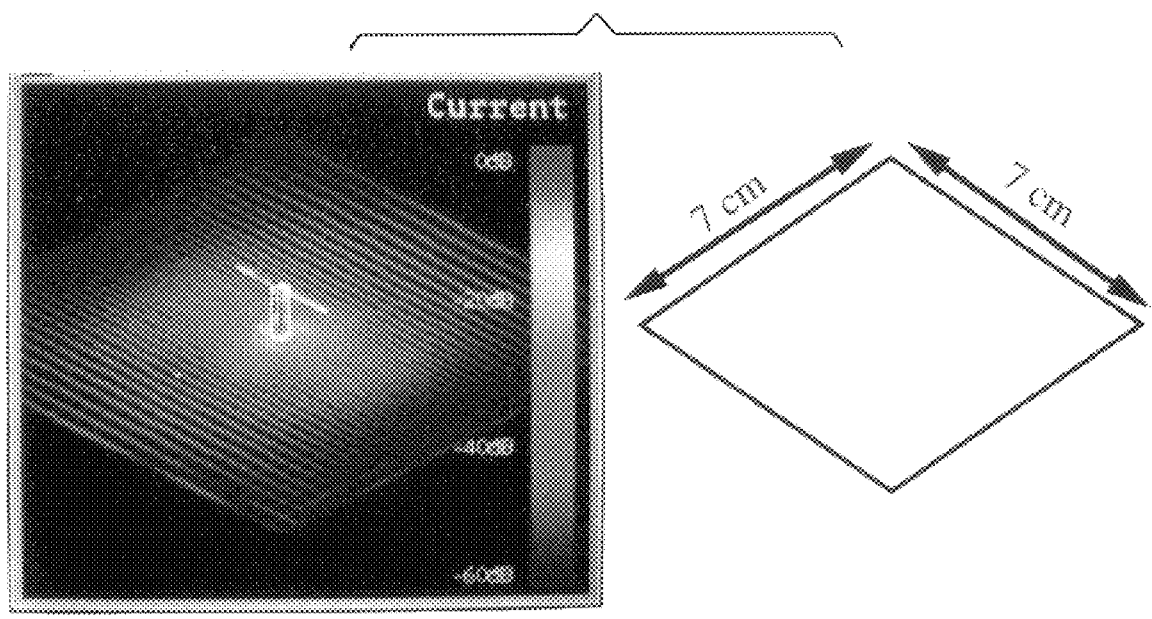
FIG. 3 shows the structure and current distribution of a scanning reception antenna element for hologram measurement use analyzed using a moment method, and is a photograph of a half-tone image shown on a display.

FIG. 3 shows the structure and current distribution of a scanning reception antenna element for hologram measurement (f=10 GHz) that includes a balun and is analyzed by a moment method. The total directivity of the antenna were obtained from this current distribution, and computer simulation of a hologram observation and image reconstruction was carried out.

In the computer simulation described hereinbelow, the size of the hologram measurement surface is D=19.2 $\lambda$, the sampling interval is 0.3 $\lambda$, the number of samples is 64×64= 4096, and the range of the wavesource is L=5D.

Figure 4:
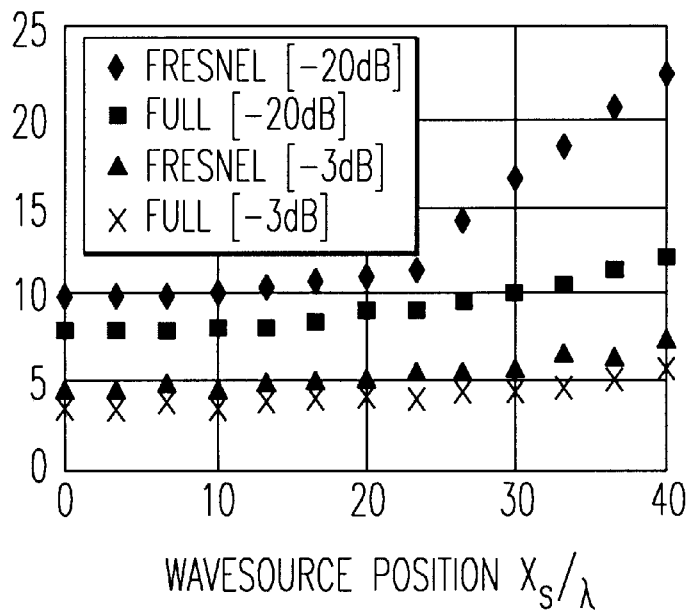
FIG. 4 is a graph showing a comparison of resolution of a reconstructed image with respect to the position of a wavesource on the x-axis.

FIG. 4 shows the results of a computer simulation carried out to compare the resolution of the reconstructed image with respect to the wavesource position on the x-axis for the method that uses quasi-Fourier transform by means of Fresnel approximation using the quasi-Fourier transform of reference (9) and the method according to the partial division Fourier transform of the embodiment of the present invention. In the table, "Fresnel" refers to the method employing quasi-Fourier transform by Fresnel approximation "Full" refers to the method by partial division Fourier transform according to the embodiment of the present invention, and the amplitude ratio of the reconstructed image spread is enclosed in brackets. Here, the wavesource is a point wavesource in the horizontal direction placed at $x_s$, $y_s$. In this simulation, the interval z' between the hologram measurement surface and the wavesource surface is $66.7\lambda$. Both a −3 dB width and a −20 dB width of the wavesource image are indicated as resolution. In a method using quasi-Fourier transform by Fresnel approximation, however, hologram measurement data are multiplied by $\exp(j\pi(x^2+y^2)/\lambda z')$ and the Fourier transform carried out, the reconstructed image thereby becoming wave number space (Fourier spectrum) and the cutting error (occurrence of spurious data due to discontinuity) of the measurement data increasing significantly and affecting the reconstructed image. The hologram measurement data must therefore be multiplied by a sufficiently smooth weighting function, for example $(1+\cos(2^{1/2}\pi |R|/D))$. For the same reason, in a method using quasi-Fourier transform, the effective area becomes approximately 64% of the hologram measurement surface area D×D, and a resolution of −3 dB in the vicinity of the z-axis becomes $\Delta 1=1.25\, z'/D$. It can also be understood from FIG. 4 that, in a case in which a point wavesource is removed from the z-axis $x_s>z'/2$, the spread of an image at a resolution of −20 dB becomes particularly great. In this method, the antenna sensitivity of the hologram measurement given by equation (5) is of course not considered, and as a result, the absolute amplitude of the reconstructed image is inaccurate, and at $x_s=40\, \lambda$ (120 cm) is approximately 50% lower than at $x_s=0$.

In the method of the first embodiment of the present invention, weighting on the order of $(\cos(\pi|R|/2^{1/2}D))^{1/2}$ for data at edges, where cutting error is great, is sufficient. However, because this weighting gives rise to a region in which image reconstruction is prevented, an overlapping process of the transform region is executed by expanding a and b of equation (19) to non-integers. By this method, the effective area becomes 92% of the hologram measurement area D×D, and the −3 dB resolution of a point wavesource in the vicinity of the z-axis becomes $\Delta 1=1.04\, \lambda z'/D$. Moreover, as can be seen from FIG. 4, in regions in which a point wavesource diverges from the z-axis $x_s>z'/2$, −20 dB resolution Δ1 is improved by about ½ over a case in which Fresnel approximation is used.

Figure 5:
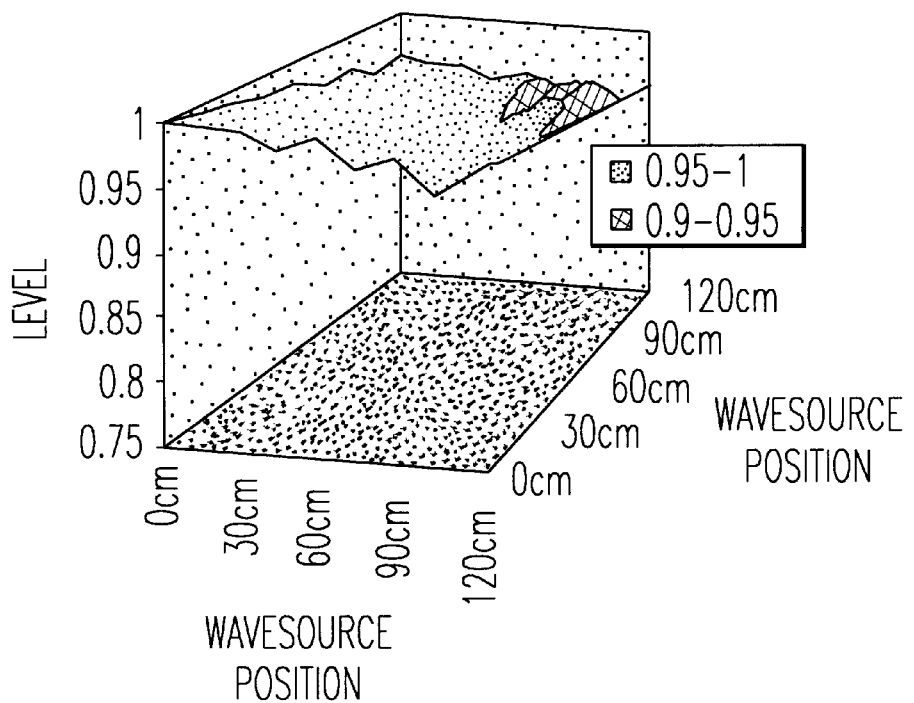
FIG. 5 is a graph showing the dependence of the amplitude value of a reconstructed image with respect to the position of the wavesource.

FIG. 5 shows the results of computer simulation carried out to investigate the amplitude probability of a reconstructed image by the method of the first embodiment of the present invention. In this simulation again, it can be seen that even when $z'=66.7\, \lambda$ and $x_s=40\, \lambda$ (120 cm), the amplitude level error of the reconstructed image is within 7%. In the results of simulation shown in FIG. 5, the level error can be considered to be comparatively large when the wavesource position in the vicinity of $x_s=y_s=40\, \lambda$ (120 cm) because, in the conversion from equation (16) to equation (18), the change in the reception antenna directivity within the range of ±D/2 within the wavesource surface as seen from the center of the hologram measurement surface cannot be seen as negligible relative to the change in $\exp(j2\pi r'_{m,n}/\lambda)$.

Figure 6:
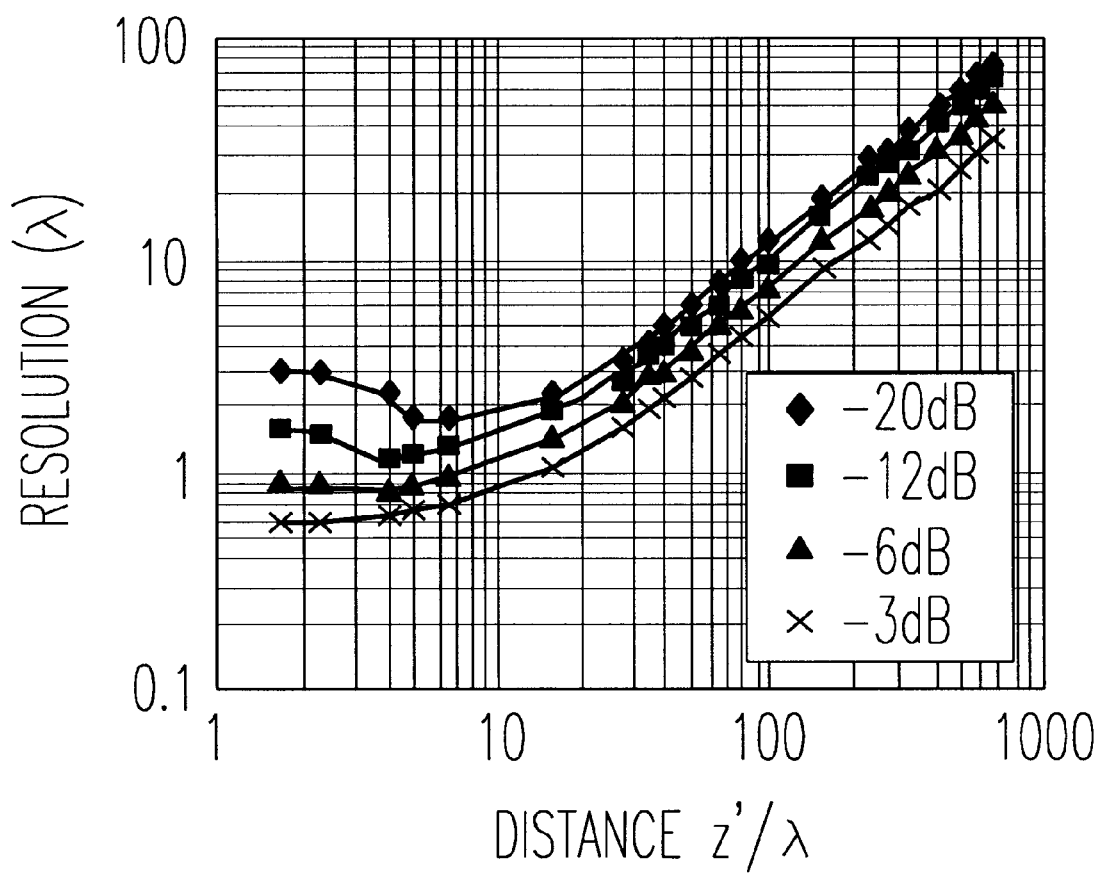
FIG. 6 is a graph showing the dependence of hologram reconstruction resolution on the distance z' from the measurement surface to the wavesource point.

FIG. 6 shows the results of computer simulation carried out to investigate the relation between the resolution of hologram reconstruction and the distance z' from the measurement surface to the wavesource point in the method of the first embodiment of the present invention. From these simulation results it can be seen that Δ1 is proportional to z' when z'>D. For example, at −3 dB resolution, Δ1 is substantially equal to $\lambda z'/D$. These results indicate that angle-resolution is substantially fixed. In addition, the change in resolution with respect to z' decreases when z'<D, and at −3 dB resolution, resolution is substantially fixed at Δ1=from 0.6 to 1.2 λ. As z' approaches the vicinity of λ, however, resolution, particularly at −12 dB or −20 dB, gets much worse, and at a resolution of −20 dB, for example, a minimum $\Delta 1=1.7\, \lambda$ can be obtained when z'=from 5 λ to 7 λ, but when $z'=2\, \lambda$, $\Delta 1=3\lambda$. As explained hereinabove, this state is believed to result from entering a region in which compensation of the influence of directivity of the antenna is no longer possible.

The experimental results of hologram observation will next be described.

Using a hologram observation device that allows a certain level of fluctuation in observation frequency over time for the purpose of observing electromagnetic wave leakage from an actual device, emission from a dipole antenna was observed, experimental confirmation of the range of visualization as well as resolution and accuracy was carried out, and moreover, the results of carrying out visualization experiments of electromagnetic wavesource leakage from an actual device (metal cabinet) are described.

Figure 7:
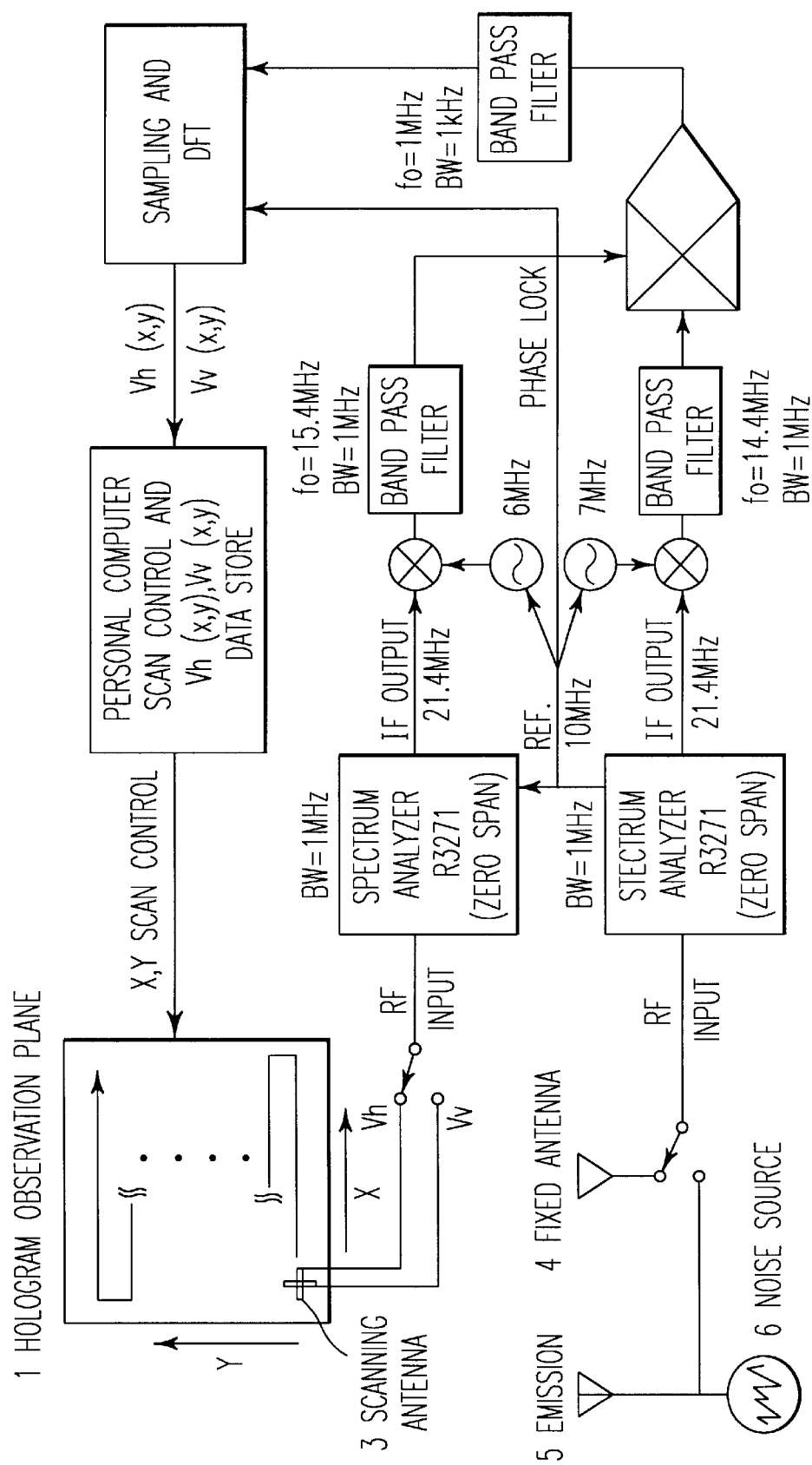
FIG. 7 is a schematic structural view showing a measurement device prepared on an experiment basis for observing a radio hologram.

FIG. 7 shows the construction of a measurement device prepared for the purpose of experimentation for observing actual radio holograms. In FIG. 7, hologram measurement is carried out at a scanning antenna surface. Signals received at scanning antenna 3 are frequency selected at spectrum analyzer (Advantest R3271), converted to an IF (intermediate frequency) of 21.4 MHz, and filtered to a 1 MHz band. To cancel phase fluctuation due to the passage of time during hologram measurement, a reference wave is received at an additional completely phase-locked spectrum analyzer. In addition, the reference wave is taken from fixed antenna 4 or a direct noise generation source 6.

The 21.4 MHz hologram measurement signal and reference signal that are received at the two spectrum analyzers and converted to an intermediate frequency are further converted to 15.4 MHz and 14.4 MHz, respectively, and multiplied at a multiplier. In the output signal of this multiplier, the multiplication of the frequency component of the hologram measurement signal and the identical frequency component of the reference signal are all converted to a single frequency of 1 MHz, and in addition, the phase of this 1 MHz signal contains information that is proportional to the phase difference between the hologram measurement signal and reference signal.

This 1 MHz signal is sampled at a sampling clock that is synchronized at all local oscillators, and amplitude distribution and relative phase distribution with respect to the reference wave at the hologram measurement surface can be obtained through synchronous detection using a Fourier integral. Giving due consideration to the reconstruction resolution of the hologram image, the experimental frequency range in this device was from 2 GHz to 26.5 GHz. In addition, hologram measurement scanning range was 57 cm by 57 cm, and the antenna movement steps were less than λ/2 based on sampling theory.

Figures 8, 9:
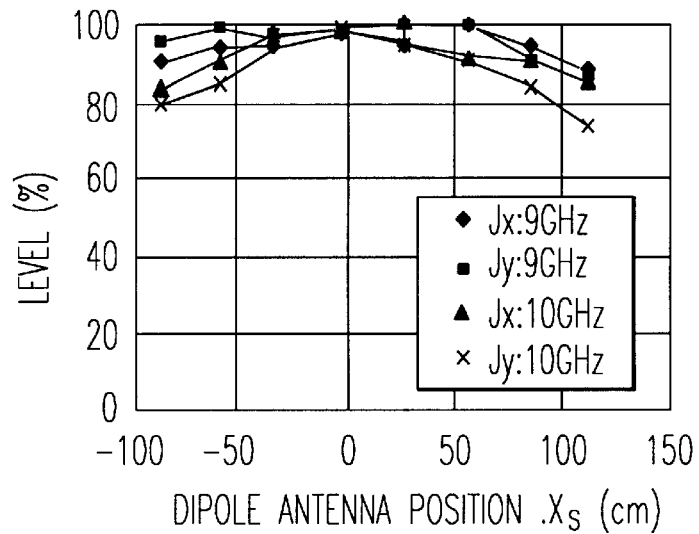
FIG. 8 is a graph showing the experimental results of amplitude values constructed in hologram image reconstruction of a dipole antenna placed on a horizontal axis.
FIG. 9 is a table showing the visualization resolution of point wavesources.

FIG. 8 shows the results of observation by dipole antenna carried out to experimentally confirm the visualization accuracy of an electromagnetic wavesource by the first embodiment of the present invention. The experimental observations were carried out using frequencies of 9 GHz and 10 GHz and frequency-modulated waves of a 1 MHz band. A dipole antenna was used as the wavesource, tilted 45 degrees from the x-axis, at a distance of z'=200 cm from the observation surface, and shifted at 30 cm intervals from −90 cm to 120 cm on the x-axis. In FIG. 8, hologram measurement and wavesource reconstruction are carried out and the amplitude values of the wavesource image plotted for each of the various positions. In these experimental observations, the employed reference signal was produced by splitting a signal inputted to a dipole antenna.

These experimental results exhibit considerable dependence upon the frequency and polarization of observation, and the accuracy of the experiments is not necessarily high. The maximum amplitude error is 26%, and considerably more error occurs than in the simulation results shown in FIG. 5. Looking at the data for 9 GHz, however, the simulation results substantially agree. Sources of the high level of error that can be considered include aberration in the directivity of the dipole antenna used as the object of observation as well as aberration in the directivity of the antenna used for hologram measurement. As shown in FIG. 9, the experimental results agree well with simulation results with regard to the visualization resolution of a point wavesource. At −20 dB resolution, for example, Δ1=2.3 to 3.4 (λz'/D).

Figures 10A, 10B, 10C:
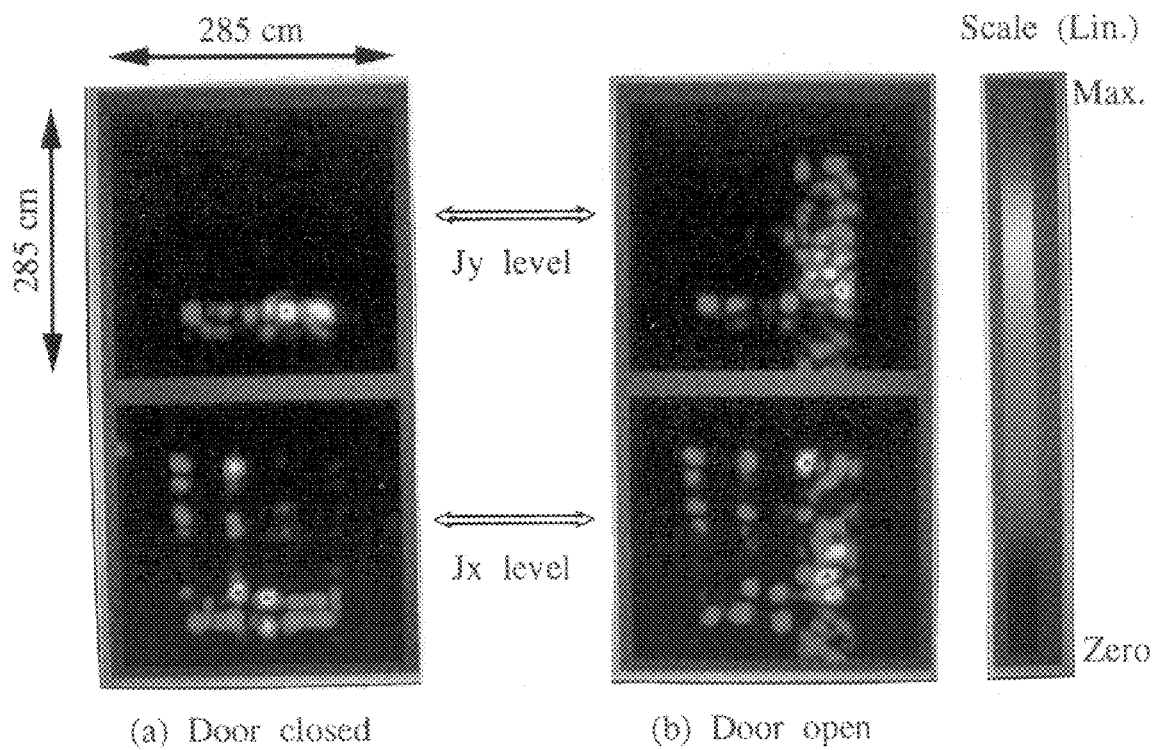
FIG. 10 is a photograph of a half-tone image shown on a display of electromagnetic wave images of EUT (Equipment Under Test) observed at 10 GHz.
Figure 11A:
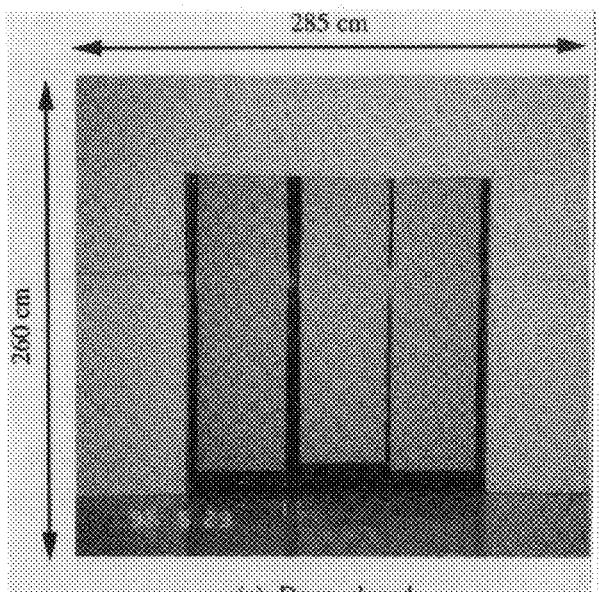
FIG. 11 is a photograph of EUT used in electromagnetic wave image visualization experiments.
Figure 11B:
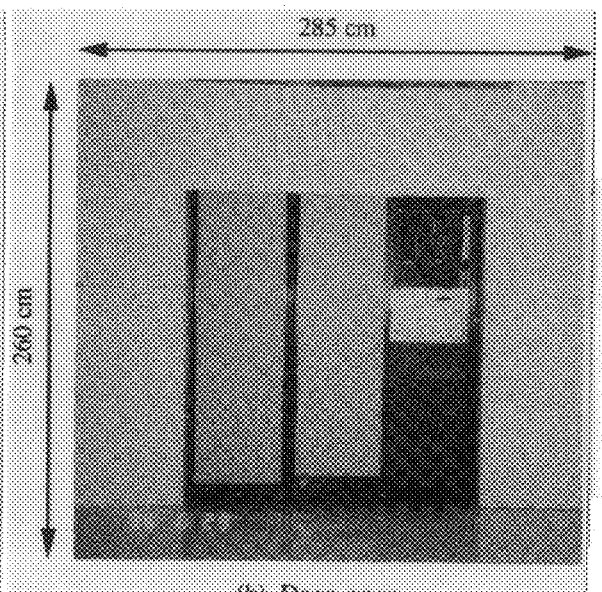

FIG. 10 shows the results of experimental visualization assuming electromagnetic wave leakage from an actual, comparatively large device (EUT, Equipment Under Test). Hologram measurement was carried out both for a state in which all doors of the EUT were closed and for a state in which only one door was open. FIG. 11 shows a photograph of the EUT used as the object of observation. The measurements shown in FIG. 10 were obtained by placing a 1 MHz band frequency-modulated wavesource at 10 GHz inside the EUT and then conducting hologram observations at a position inside the room and 2 m away from the EUT. In addition, the range of hologram measurement was 57 cm by 57 cm, the scan steps were 0.9 cm, and the range of visualization was 285 cm by 285 cm. A fixed antenna placed close to the EUT was used as the reference wave.

As can be seen from the visualization results shown in FIG. 10, in the state in which a door is opened (right side), both the $J_x$ component and $J_y$ component are widely distributed in the door opening, while in closed-door state, only the $J_x$ component is concentrated in the door gap. It can further be seen that an open portion is present in the lower portion of the EUT for leading out cables, and that emissions from this area are particularly strong when the door is closed. It can further be seen that emissions from the open portion in the lower portion of the EUT are reflected by the floor surface.

As explained hereinabove, the present invention has the effect of reducing the time necessary for obtaining visualization results from hologram measurement data V(R) through the use of partial division FFT.

For example, if the number of items of data V(R) is N=64 and the visualization points M=640, the amount of computation is approximately 1/1000 that required by the method of the prior art described hereinabove, and the time required to obtain the visualization results can also be reduced to a practical level.

In addition, by overlapping the segmentation of the reconstruction area of the reconstructed hologram image, the present invention has the effect of avoiding use of data at edges having a high level of cutting error, thereby allowing generation of a reconstructed image in segment units in which accuracy improves with proximity to the center of a segment.

To confirm the effectiveness of the present invention, an investigation was carried out by computer simulation relating to the range of application as well as to the resolution and accuracy of the present invention in which a numerical hologram reconstruction method that does not use Fresnel approximation or Fraunhofer approximation was derived from a Fourier transform by partial division that includes compensation of directivity of the reception antenna in order to obtain a relatively high resolution and wide range of visualization even when the hologram measurement surface is small with respect to the device serving as the object of observation.

Next, using a hologram observation device that allows a certain level of fluctuation in observation frequency over time for the purpose of observingelectromagnetic wave leakage from an actual device, emission from a dipole antenna was observed and experimental confirmation carried out regarding the range of visualization as well as-resolution and accuracy, thereby finally showing the experimental visualization results of electromagnetic wavesource leakage from an actual device (metal cabinet) and proving the effectiveness of the present invention.

The second embodiment of the present invention will next be described with reference to the accompanying figures.

Figure 12:
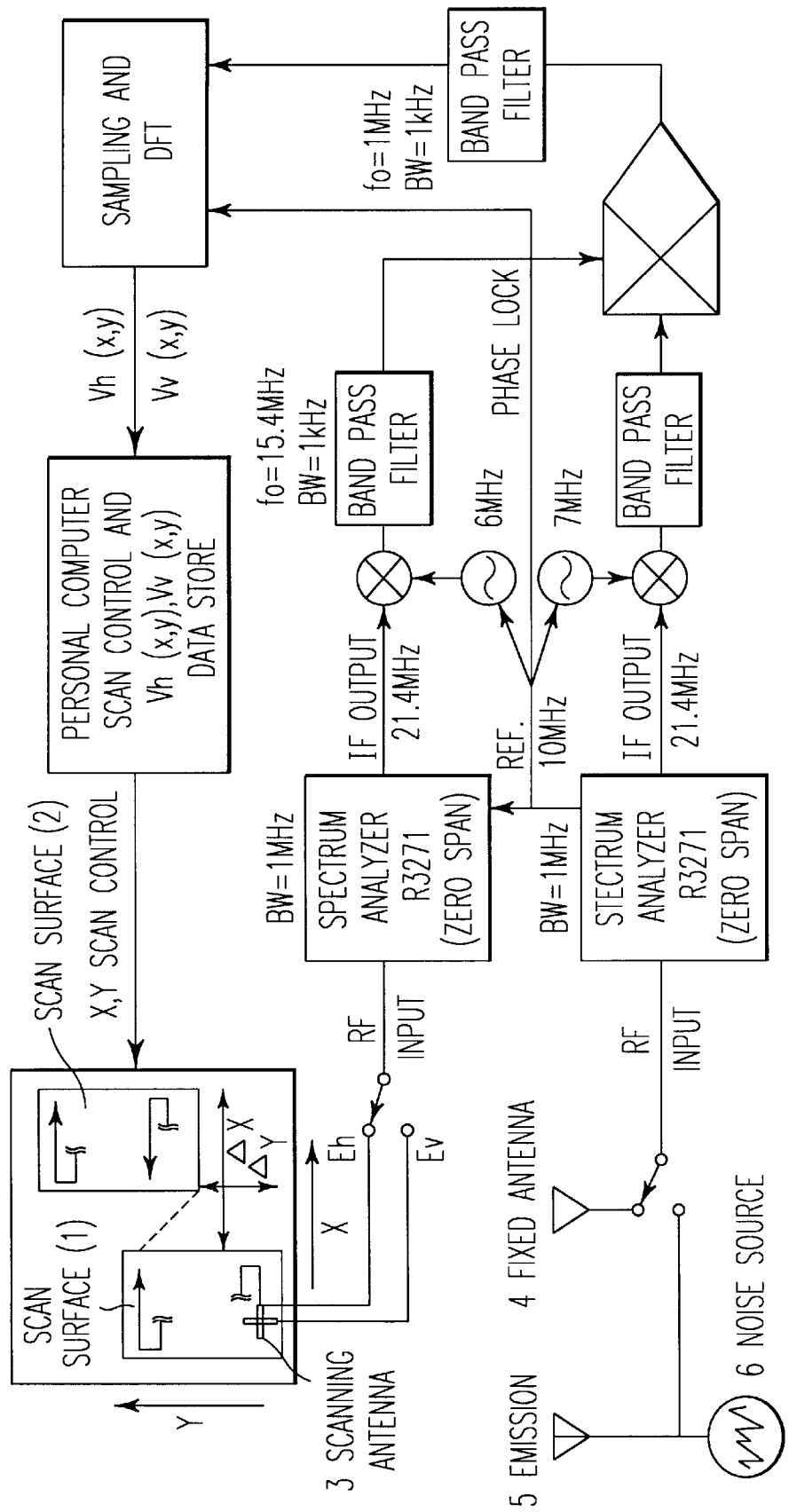
FIG. 12 is a schematic structural view of a measurement device prepared on an experimental basis for observing radio holograms according to the second embodiment of the present invention.

As shown in FIG. 12, hologram observation is carried out on two scan surfaces, scan surface (1) and scan surface (2). Two probe antennas, a horizontal polarization and a vertical polarization probe antenna, are placed on each scan surface, the voltage vectors received by these antennas being:

$$V_1(R) = \begin{bmatrix} V_{h1}(R) \\ V_{v1}(R) \end{bmatrix} = \begin{bmatrix} V_{h1}(x, y) \\ V_{v1}(x, y) \end{bmatrix} \quad (21)$$

for scan surface (1); and $$V_2(R) = \begin{bmatrix} V_{h2}(R) \\ V_{v2}(R) \end{bmatrix} = \begin{bmatrix} V_{h2}(x, y) \\ V_{v2}(x, y) \end{bmatrix} \quad (22)$$

for scan surface (2).

In FIG. 12, Δx and Δy indicate the amount of offset of scan surface (1) and scan surface (2).

The polar coordinate angles between each antenna placed at point R=(x, y; z=0) on scan surface (1) and the wavesource current vector of point R'=(x', y', z') are:

$$\theta_x = \frac{\pi}{2} + \tan^{-1}\left[\frac{x-x'}{\sqrt{z^2(y-y')^2}}\right] \quad (23)$$

$$\theta_y = \frac{\pi}{2} + \tan^{-1}\left[\frac{y-y'}{\sqrt{z^2(x-x')^2}}\right] \quad (24)$$

$$\theta_z = \frac{\pi}{2} + \tan^{-1}\left[\frac{z}{\sqrt{(x-x')^2 + (y-y')^2}}\right] \quad (25)$$

$$\phi_z = \frac{\pi}{2}\tan^{-1}\left[\frac{y-y'}{x-x'}\right] \quad (26)$$

$$\theta_h = \pi - \theta_x \quad (27)$$

$$\theta_v = \pi - \theta_y \quad (28)$$

$$\phi_h = \frac{\pi}{2} + \tan^{-1}\left[\frac{y-y'}{z}\right] \quad (29)$$

$$\phi_v = \frac{\pi}{2} + \tan^{-1}\left[\frac{x-x'}{z}\right] \quad (30)$$

The polar coordinate angles between each antenna placed on point R=(x, y; z=0) on scan surface (2) and the wavesource current vector of point R'=(x', y', z') are derived by replacing x by x+Δx and replacing y by y+Δ in equation (12) to equation (19), resulting in $\theta_x'$, $\theta^{y'}$, $\theta_z'$, $\phi_z'$, $\theta_h'$, $\theta_v'$, $\phi_h'$, and $\phi_v'$.

The overall directional characteristics of the probe-antennas used in the hologram observation are calculated by, for example, a moment method, and if the main polarization sensitivity of these probe antennas is Aθ and the cross polarization sensitivity is Aφ, the reception antenna sensitivity matrix of the horizontal polarization reception antenna according to the wavesource current vector is:

$$\tilde{A}_H(R - R') = \begin{bmatrix} A_\theta(\theta_h, \phi_h)\sin\theta_x & A_\phi(\theta_h, \phi_h)\sin\theta_y & (A_\theta(\theta_h, \phi_h)\cos\phi_z + A_\phi(\theta_h, \phi_h)\sin\phi_z)\sin\theta_z \\ A_\theta(\theta_v, \phi_v)\sin\theta_x & A_\phi(\theta_v, \phi_v)\sin\theta_y & (A_\theta(\theta_v, \phi_v)\cos\phi_z + A_\phi(\theta_v, \phi_v)\sin\phi_z)\sin\theta_z \\ A_\theta(\theta'_h, \phi'_h)\sin\theta'_x & A_\phi(\theta'_h, \phi'_h)\sin\theta'_y & (A_\theta(\theta'_h, \phi'_h)\cos\phi'_z + A_\phi(\theta'_h, \phi'_h)\sin\phi'_z)\sin\theta'_z \end{bmatrix} \quad (31)$$

and the reception antenna sensitivity matrix of the vertical polarization reception antenna due to the wavesource current vectors is:

$$\tilde{A}_H(R - R') = \begin{bmatrix} A_\theta(\theta_h, \phi_h)\sin\theta_x & A_\phi(\theta_h, \phi_h)\sin\theta_y & (A_\theta(\theta_h, \phi_h)\cos\phi_z + A_\phi(\theta_h, \phi_h)\sin\phi_z)\sin\theta_z \\ A_\theta(\theta_v, \phi_v)\sin\theta_x & A_\phi(\theta_v, \phi_v)\sin\theta_y & (A_\theta(\theta_v, \phi_v)\cos\phi_z + A_\phi(\theta_v, \phi_v)\sin\phi_z)\sin\theta_z \\ A_\phi(\theta'_v, \phi'_v)\sin\theta'_x & A_\theta(\theta'_v, \phi'_v)\sin\theta'_y & (A_\phi(\theta'_v, \phi'_v)\cos\phi'_z + A_\theta(\theta'_v, \phi'_v)\sin\phi'_z)\sin\theta'_z \end{bmatrix} \quad (32)$$

Extending equation (7) of the prior art to three dimensions:

$$J(R') = \int \tilde{A}^{-1}(R - R') \cdot V(R) \cdot \exp(j2\pi r/\lambda) \cdot r\, dx\, dy \quad (33)$$

from which the three wavesource current vector components can be found and visualization achieved.

$$J(R') = \begin{bmatrix} J_x(R') \\ J_y(R') \\ J_z(R') \end{bmatrix} = \begin{bmatrix} J_x(x', y', z') \\ J_x(x', y', z') \\ J_z(x', y', z') \end{bmatrix} \quad (34)$$

In this case, if:

$$|\tilde{A}_H(R-R')| \leq |\tilde{A}_V(R-R')| \quad (35)$$

then error of the reception antenna sensitivity matrix of the horizontal polarization reception antenna will be smaller than error of the reception antenna sensitivity matrix of the vertical polarization reception antenna, whereby:

$$\tilde{A}^{-1}(R-R') = \tilde{A}_H^{-1}(R-R') \quad (36)$$

and:

$$V(R) = \begin{bmatrix} V_{h1}(R) \\ V_{v1}(R) \\ V_{h2}(R) \end{bmatrix} = \begin{bmatrix} V_{h1}(x, y) \\ V_{v1}(x, y) \\ V_{h2}(x + \Delta x, y + \Delta y) \cdot \\ \exp(j2\pi(r' - r)/\lambda) \cdot r'/r \end{bmatrix} \quad (37)$$

On the other hand, if:

$$|\tilde{A}_H(R-R')| \leq |\tilde{A}_V(R-R')| \quad (38)$$

then error of the reception antenna sensitivity matrix of the vertical polarization reception antenna is smaller than error of the reception antenna sensitivity matrix of the horizontal polarization reception antenna, whereby:

$$\tilde{A}^{-1}(R-R') = \tilde{A}_V^{-1}(R-R') \quad (39)$$

and:

$$V(R) = \begin{bmatrix} V_{h1}(R) \\ V_{v1}(R) \\ V_{v2}(R) \end{bmatrix} = \begin{bmatrix} V_{h1}(x, y) \\ V_{v1}(x, y) \\ V_{v2}(x + \Delta x, y + \Delta y) \cdot \\ \exp(j2\pi(r' - r)/\lambda) \cdot r'/r \end{bmatrix} \quad (40)$$

However, in equations (37) and (38):

$$r = \sqrt{(x - x')^2 + (y - y')^2 + z^2} \quad (41)$$

and:

$$r' = \sqrt{(x + \Delta x - x')^2 + (y + \Delta y - y')^2 + z^2} \quad (42)$$

As described hereinabove, by comparing the determinants of the reception antenna sensitivity matrices, finding the magnitude of error of the reception antenna sensitivity matrix of the vertical polarization reception antenna and error of the reception antenna sensitivity matrix of the horizontal polarization reception antenna, selectively using the received voltage vectors V(R) and reception antenna sensitivity inverse matrix $A^{-1}(R-R')$, the three components of the wavesource current vector J(R') can be found and visualization achieved. Because the z component $J_z$ of the wavesource current vector J(R') cannot be observed from the front, this selective operation is of key importance for avoiding the sensitivity null corresponding to $J_z$.

The computation of the determinant of the reception antenna sensitivity matrix is dependent only upon the position vector R' of the wavesource point and therefore can be determined without computing for all integral intervals. In other words, if:

$$|\tilde{A}_H(0-R')| \geq |\tilde{A}_V(0-R')| \quad (43)$$

then the error of the reception antenna sensitivity matrix of the horizontal polarization reception antenna is smaller than the error of the reception antenna sensitivity matrix of the vertical polarization reception antenna, whereby:

$$\tilde{A}^{-1}(R-R') = \tilde{A}_H^{-1}(R-R') \quad (44)$$

resulting in:

$$V(R) = \begin{bmatrix} V_{h1}(R) \\ V_{v1}(R) \\ V_{h2}(R) \end{bmatrix} = \begin{bmatrix} V_{h1}(x, y) \\ V_{v1}(x, y) \\ V_{h2}(x + \Delta x, y + \Delta y) \cdot \\ \exp(j2\pi(r' - r)/\lambda) \cdot r'/r \end{bmatrix} \quad (45)$$

On the other hand, if:

$$|\tilde{A}_H(0-R')| < |\tilde{A}_V(0-R')| \quad (46)$$

then the error of the reception antenna sensitivity matrix of the vertical polarization reception antenna is smaller than the error of the reception antenna sensitivity matrix of the horizontal polarization reception antenna, and as a result:

$$\tilde{A}^{-1}(R-R') \approx \tilde{A}_V^{-1}(R-R') \quad (47)$$

resulting in:

$$V(R) = \begin{bmatrix} V_{h1}(R) \\ V_{v1}(R) \\ V_{v2}(R) \end{bmatrix} = \begin{bmatrix} V_{h1}(x, y) \\ V_{v1}(x, y) \\ V_{v2}(x + \Delta x, y + \Delta y) \cdot \\ \exp(j2\pi(r' - r)/\lambda) \cdot r'/r \end{bmatrix} \quad (48)$$

The present invention as described in the foregoing explanation comprises: a step for carrying out radio hologram observation at two scan surfaces, a first scan surface and a second scan surface, placing a horizontal polarization probe antenna and a vertical polarization probe antenna on each scan surface, and recording the voltage vector distribution received by the antennas; a step for calculating all directional characteristics of the probe antennas using a moment method, finding the reception antenna sensitivity matrix of the horizontal polarization reception antenna and the reception antenna sensitivity matrix of the vertical polarization reception antenna due to wavesource current vectors; and a step for comparing the determinants of the reception antenna sensitivity matrices, finding the magnitude of the error of the reception antenna sensitivity matrix of the vertical polarization reception antenna and the error of the reception antenna sensitivity matrix of the horizontal polarization reception antenna, and, selectively using the received voltage vectors and reception antenna sensitivity inverse matrix, finding the three wavesource current vector components and effecting visualization; whereby the present invention has the effect of enabling visualization of three wavesource current vector components. By extending the visualization of wavesource current vector from two components to three components, the present invention has the effect of improving the accuracy of wave visualization from ±6 dB to ±1 dB.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A wavesource image visualization method realized by using partial division Fast Fourier Transform (FFT) to accelerate computational holography, which is a numerical reconstruction method of hologram measurement data, obtained by means of radio hologram observation, comprising the steps of:

(a) segmenting the reconstruction region of a hologram reconstructed image by the size of a hologram measurement surface;

(b) executing a first FFT on the product of the hologram measurement data and a weighting function;

(c) assigning a reconstruction focal distance and a numeral pair designating a segment of said reconstructed image, and executing a second FFT on the product of a weighting function and a value obtained by multiplying an antenna sensitivity inverse matrix for each of said segments by an inverse propagation function;

(d) executing an IFFT (Inverse Fast Fourier Transform) on the product of said first FFT and said second FFT;

(e) compensating, for each segment of the reconstruction region, said weighting function used in multiplying said hologram measurement data;

(f) compensating, for each segment unit of the reconstruction region, said weighting function used in multiplying the value obtained by multiplying said antenna sensitivity inverse matrix for each segment by said inverse propagation function;

(g) displaying output of step (f) at a position that designates said segment and making output of step (f) a segment reconstructed image; and (h) performing all of the above-described operations for all segments and producing a hologram reconstructed image.

2. A wavesource image visualization method according to claim 1 realized by using partial division FFT to accelerate computational holography, wherein said segmentation produces overlapping segments.

3. A wavesource image visualization method that visualizes three wavesource current vector components from hologram measurement data obtained by means of radio hologram observation, comprising the steps of:

carrying out radio hologram observation on two scan surfaces, a first scan surface and a second scan surface; placing at least two probe antennas, a horizontal polarization reception antenna and a vertical polarization reception antenna, on each of said scan surfaces; and recording voltage vector distribution received by said antennas;

calculating total directional characteristics of said probe antennas using a moment method, and finding a reception antenna sensitivity matrix of said horizontal polarization reception antenna and a reception antenna sensitivity matrix of said vertical polarization reception antenna brought about by wavesource current vectors; and comparing determinants of said reception antenna sensitivity matrices, finding a magnitude of error of said reception antenna sensitivity matrix of said vertical polarization reception antenna and error of said reception antenna sensitivity matrix of said horizontal polarization reception antenna, and selectively using received voltage vectors and reception antenna sensitivity inverse matrices to find and visualize three wavesource current vector components.

* * * * *